United States Patent
Zhang et al.

(10) Patent No.: US 9,123,719 B2
(45) Date of Patent: Sep. 1, 2015

(54) METAL-OXIDE-METAL CAPACITOR

(75) Inventors: Jiong Zhang, Irvine, CA (US); Joseph King, Aliso Viejo, CA (US); Akira Ito, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 307 days.

(21) Appl. No.: 13/533,280

(22) Filed: Jun. 26, 2012

(65) Prior Publication Data

US 2013/0342955 A1    Dec. 26, 2013

(51) Int. Cl.
*H01G 4/002* (2006.01)
*H01L 23/522* (2006.01)
*H01L 27/08* (2006.01)

(52) U.S. Cl.
CPC ........ *H01L 23/5223* (2013.01); *H01L 27/0805* (2013.01); *Y10T 29/417* (2015.01)

(58) Field of Classification Search
USPC ................ 361/301.1, 301.4, 311–313, 306.1, 361/306.3; 257/516, 532
See application file for complete search history.

(56) References Cited

U.S. PATENT DOCUMENTS

| | | | | |
|---|---|---|---|---|
| 5,583,359 A | * | 12/1996 | Ng et al. | 257/306 |
| 7,126,809 B2 | * | 10/2006 | Iioka et al. | 361/306.3 |
| 7,485,912 B2 | | 2/2009 | Wang | |
| 2010/0271753 A1 | | 10/2010 | Wang et al. | |

FOREIGN PATENT DOCUMENTS

TW    200915495    4/2009

OTHER PUBLICATIONS

Brunner, Timothy A., Why Optical Lithography Will Live Forever, J. Vac. Sci. Technol. B 21(6), pp. 2632-2637, American Vacuum Society, Nov./Dec. 2003.
TW 200915495, English abstract, downloaded from Espacenet, Dec. 1, 2014, 2 pages.

* cited by examiner

*Primary Examiner* — Nguyen T Ha
(74) *Attorney, Agent, or Firm* — Brinks Gilson & Lione

(57) ABSTRACT

A semiconductor structure may implement a metal-oxide-metal capacitor. When layer design rules change from one layer to the next, the structure may change the direction of the interleaved plates of the capacitor. For example, when the metallization width or spacing design rules change from layer M3 to layer M4, the structure may run the capacitor traces in different directions (e.g., orthogonal to one another) on M3 as compared to M4. Among the layers that adhere to the same design rules, for example layers M1, M2, and M3, the structure may run the capacitor traces in the same direction in each of the layers M1, M2, and M3. In this way, the capacitor traces overlap to large extent without misalignment on layers that have the same design rules, and the structure avoids misalignment of the capacitor traces when the design rules change.

19 Claims, 15 Drawing Sheets

METAL-OXIDE-METAL CAPACITOR

TECHNICAL FIELD

This disclosure relates circuit structures. In particular, this disclosure relates to capacitors, such as those manufactured in 20 nm or below processes.

BACKGROUND

Rapid advances in electronics technologies and semiconductor fabrication processes, driven by immense customer demand, have resulted in the worldwide adoption of electronic devices. At the same time, fabrication processes continue to achieve smaller dimensions. One of the fundamental circuit components of an electronic device is the capacitor. Improvements in capacitor fabrication techniques will allow the creation of capacitors with accurate and consistent capacitance values as the fabrication dimensions continue to shrink.

BRIEF DESCRIPTION OF THE DRAWINGS

The innovation may be better understood with reference to the following drawings and description. In the figures, like reference numerals designate corresponding parts throughout the different views.

DETAILED DESCRIPTION

Figure 1:
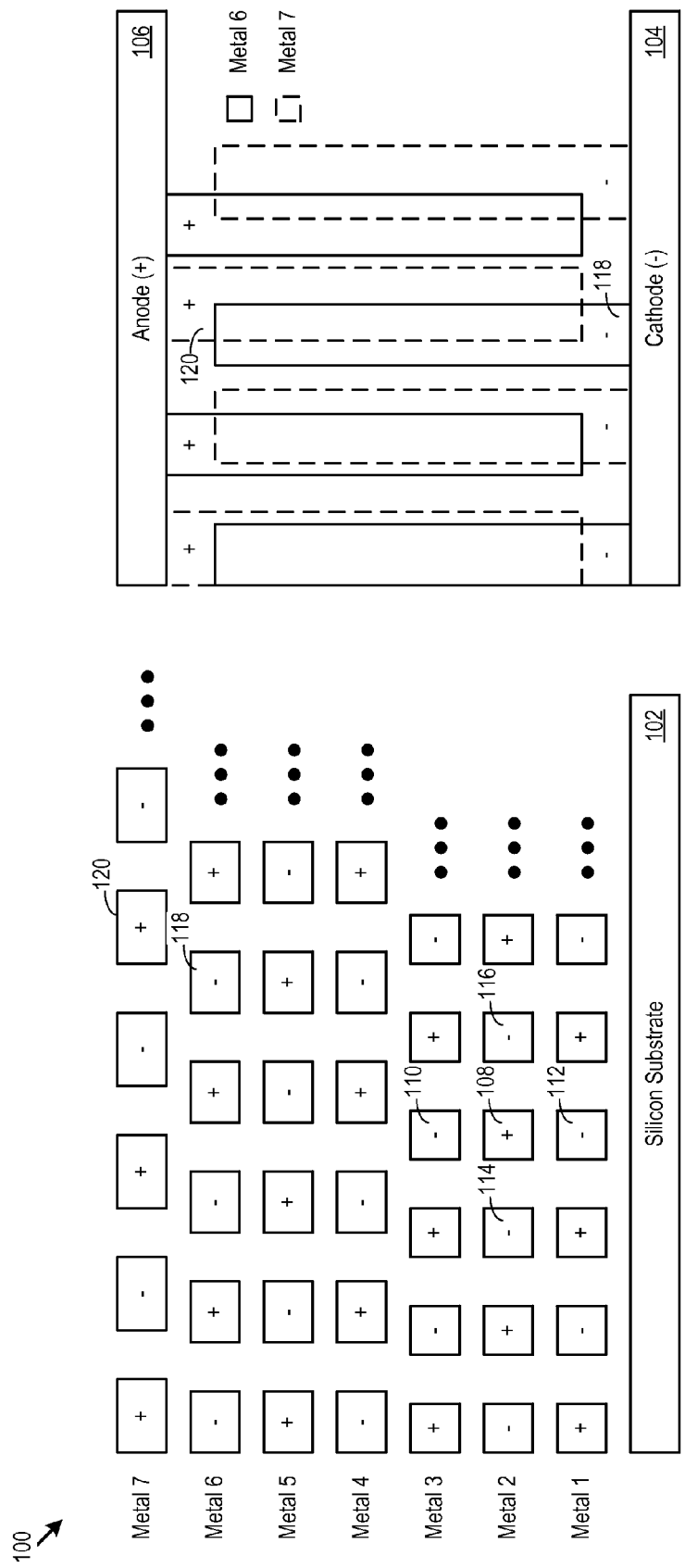
FIG. 1 shows an example layout in which changes in design rules cause misalignment of conductive traces between successive fabricated semiconductor layers in the layout.

FIG. 1 shows an example layout 100 for a capacitor structure in which changes in design rules cause misalignment of conductive (e.g., metal) traces between successive fabricated semiconductor layers in the layout. There are seven metal layers in FIG. 1, but a layout could have any number of layers. The layout 100 is fabricated, for example, on a silicon substrate 102, with insulation (e.g., silicon dioxide) between layers and traces. In the metal 1 layer, a series of conductive traces run in a particular direction, generally parallel to one other. The traces may be connected to a cathode bus 104 and an anode bus 106 and thus may be positive and negative traces that may alternate polarity in succession. The alternating traces act as interleaved capacitor plates.

Furthermore, each successive layer may alternate the polarity of traces in the vertical direction. Accordingly, any given trace may contribute to the capacitance of the structure through its interaction with multiple neighbor traces. For example, the trace 108 capacitively couples to the trace 110 on layer 3, the trace 112 on layer 1, the trace 114 on layer 2, and the trace 116 on layer 2. Obtaining the greatest capacitance from the structure depends on the precise overlap of the traces.

When design rules change, the traces may become misaligned. The misalignment leads to a lack of overlap between traces of alternate polarity. The lack of overlap reduces the capacitance of the structure. In FIG. 1, for example, the design rules are the same for layers 1, 2, and 3, but different for layers 4, 5, and 6, and also different for layer 7. In the transition from layer 6 to layer 7, for example, the change of design rules causes the significant misalignment of traces that should substantially overlap, for example the layer 6 trace 118 and the layer 7 trace 120.

Figure 2:
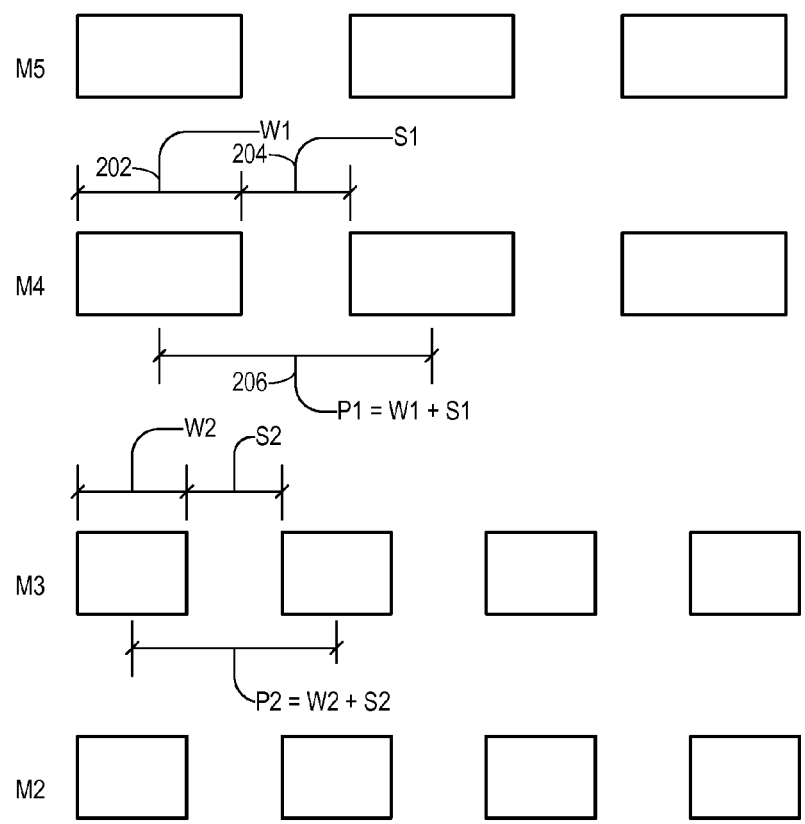
FIG. 2 is an example of design rules, and the changes in design rules between layers.

FIG. 2 is an example of design rules 200, and the changes in design rules between layers. In FIG. 2, the design rules 200 include trace width 202, trace spacing 204, and trace pitch 206. The pitch may be the spacing between centers of the traces, and may be equal to the sum of the width and the spacing. As shown in FIG. 2, the pitch for layers 2 and 3 is different than the pitch for layers 4 and 5.

The trace width 202, trace spacing 204, and trace pitch may be the minimum dimensions allowed by the fabrication techniques for those layers. In some cases, the lower layers (e.g., layers 1, 2, and 3) allow for tighter design parameters and therefore smaller feature sizes. These layers may, for example, be the layers in which transistors and interconnects are fabricated to achieve maximum circuit density. The differences in the design rules may cause misalignment of the traces between layers, however, when the traces are fabricated according to the design rules.

While certain layers (e.g., layers 1, 2, and 3) could be fabricated with greater width, spacing, or pitch than the minimum allowed, doing so would result in a loss of capacitance because the traces are farther apart than is possible. Accordingly, it is typically desirable to fabricate each layer at the minimum dimensions specified by the design rules.

Figure 3:
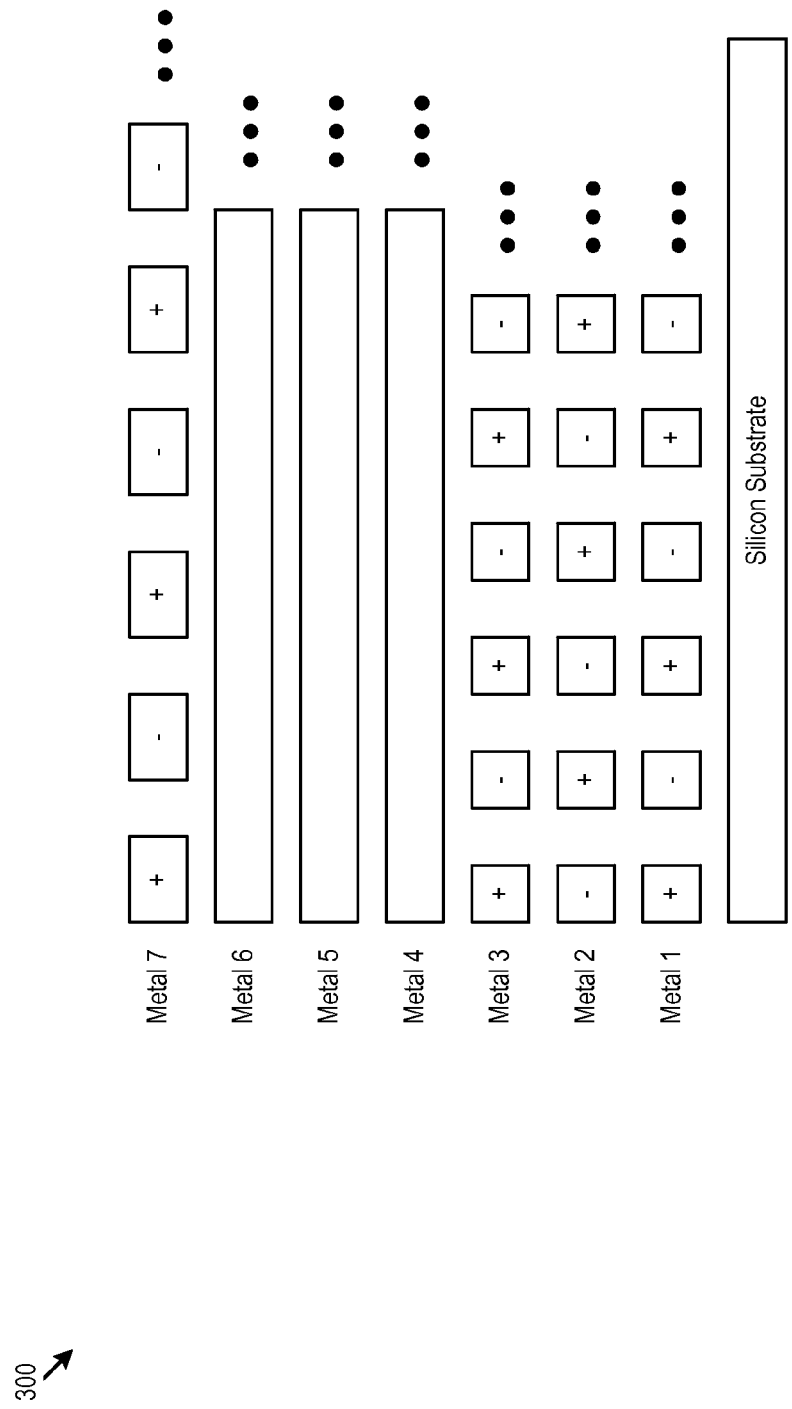
FIG. 3 shows a side view of an example layout in which conductive traces change direction between one layer and the next, when the value of a design parameter changes from one layer to the next.

FIG. 3 shows a side view of an example layout 300 in which conductive traces change direction between one layer and the next, when the design rules would cause misalignment of the traces from one layer to the next. This may occur, for example, when the value of a design parameter such as width, spacing, or pitch changes from one layer to the next. In the example in FIG. 3, the direction of the traces in layers 4, 5, and 6 are different than the direction of the traces below in layers 1, 2, and 3. Each of layers 4, 5, and 6 shares the same set of design rules, while each of layers 1, 2, and 3 share a set of design rules that is different than that of layers 4, 5, and 6. Furthermore the direction of the traces in layer 7 is different than the direction of the traces below in layers 4, 5, and 6. Layer 7 adheres to a different set of design rules than layers 4, 5, and 6.

The change in direction may be a 90 degree rotation. As a result, the traces in one layer may run orthogonally to the traces in a layer below. As a particular example shown in FIG. 3, the traces in layer 4 run orthogonally to the traces immediately below in layer 3, because there is a design rule change that would cause misalignment of the traces if the traces in layer 4 and layer 3 ran in the same direction. The deliberate change in direction of the traces will help increase capacitance of the structure for the reasons described below.

Other changes in direction may be implemented. For example, the change in direction may be 45 degrees. One consideration in choosing the change in direction is the capacitance gained or lost compared to running the traces in the same direction instead of changing direction. Thus, while a 90 degree change in direction may result in the highest overall capacitance for the structure, other changes in direction may be implemented instead. The change in direction may be chosen to meet or exceed, for example, a predetermined capacitance increase threshold compared, for example, to running the traces in the same direction.

Figure 4:
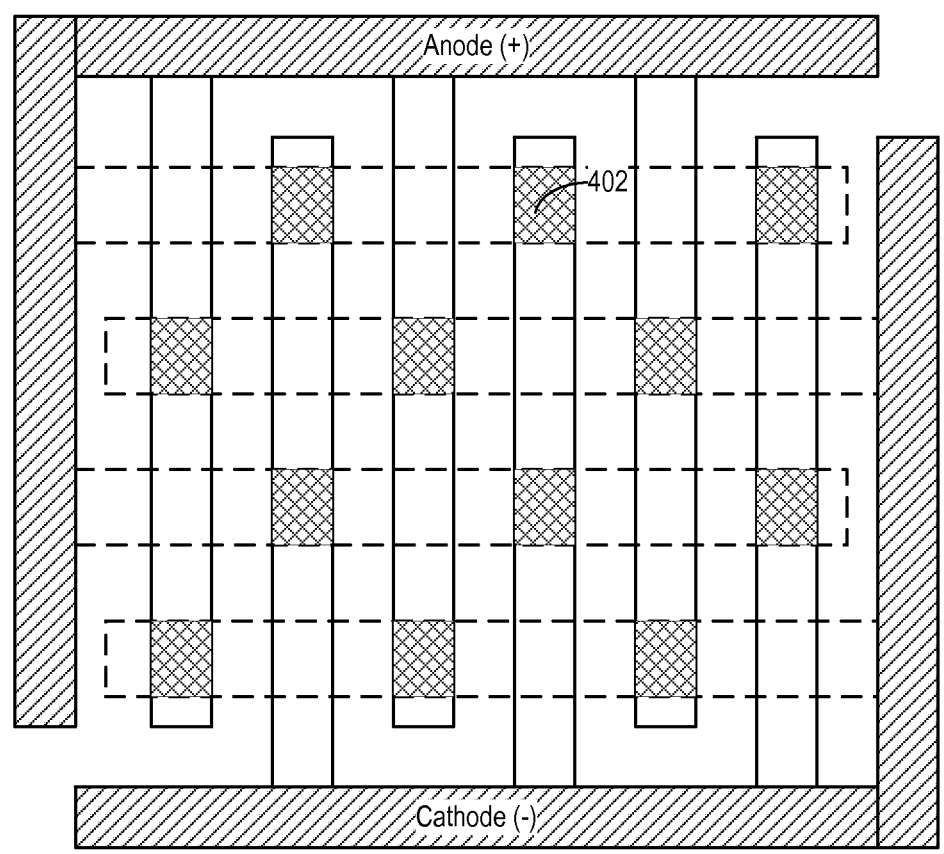
FIG. 4 shows a top view of an example layout in which conductive traces change direction between one layer and the next, when the value of a design parameter changes from one layer to the next.

FIG. 4 shows a top view of an example layout 400 in which conductive traces change direction between one layer and the next, when the value of a design parameter changes from one layer to the next. FIG. 4 shows, in particular, layers 6 and 7. In this example, layer 7 has increased width and spacing for its traces compared to layer 6. The highlighted areas (e.g., the area 402) show where positive traces overlap negative traces for the capacitor. These areas contribute to the capacitance of the structure. Although the contribution of the areas to the capacitance is not as great as it would be if the traces could fully overlap each other, the areas do contribute to a meaningful degree. As noted above, however, due to the change in the design rules, the traces cannot consistently fully overlap each other when running in the same direction. Without the change in direction to capture the capacitance resulting from the overlap areas, significant capacitance would be lost in the structure. The change in direction between layers when a design rule changes can increase the capacitance of the structure by 5-20% or more.

The next several Figures give an example of a six layer capacitor structure. Each of the six layers is given a label M1, M2, M3, M4, M5, or M6. The labels refer to metallization ("M") layers, and metallization forms the conductive traces. In other implementations, other types of conductive traces may be employed and the layers may be given any other designation.

Figure 5:
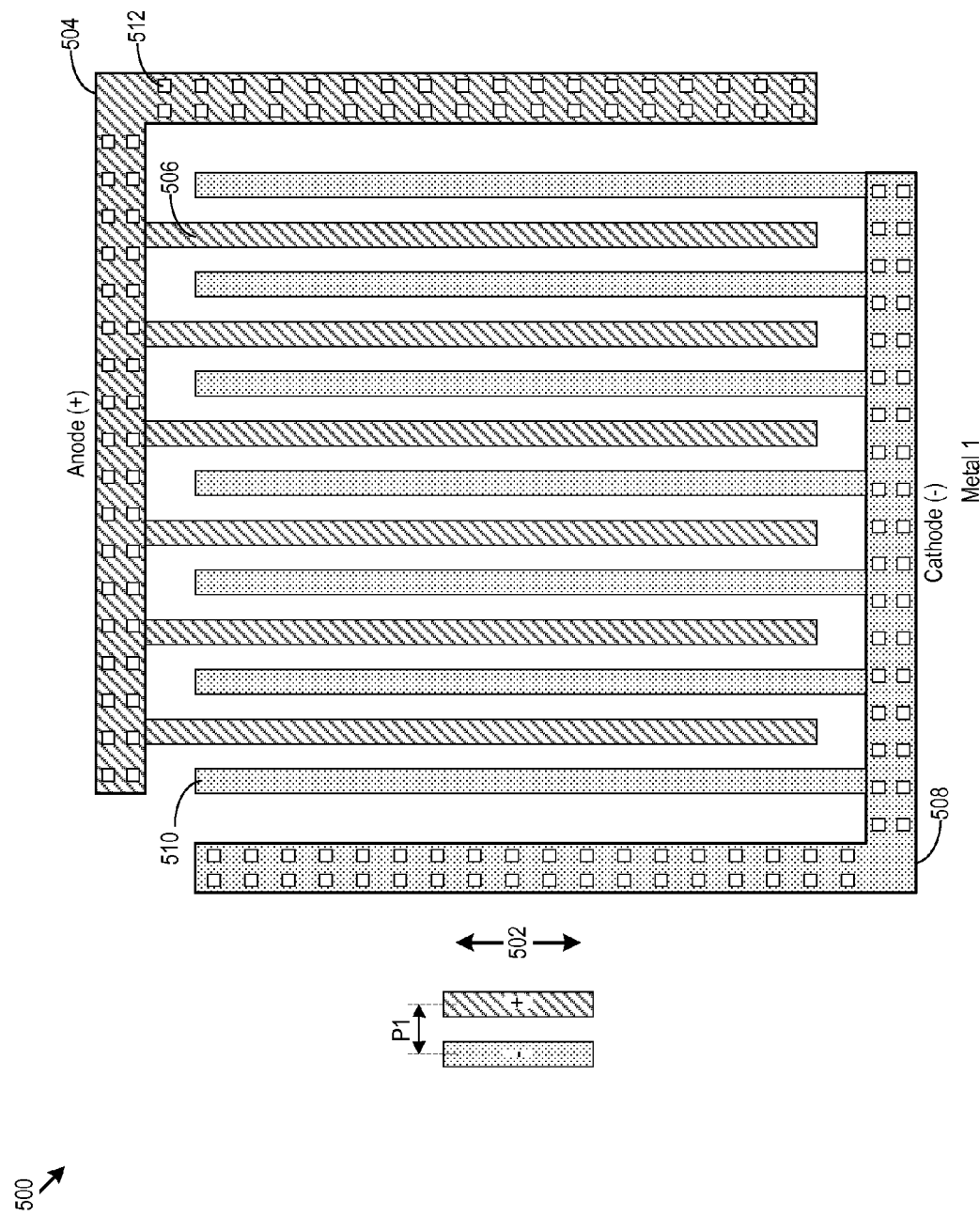
FIG. 5 shows a top view of an M1 layer in which conductive traces run in a particular direction and are positioned according to a design parameter (e.g., pitch) having a first value for the M1 layer.

FIG. 5 shows a top view of an M1 layer 500 in which metal traces run in a particular direction 502 and are positioned according to a design parameter (e.g., pitch) having a first value (e.g., P1) for the M1 layer. In FIG. 5, an anode bus 504 connects together the anode traces 506, while a cathode bus 508 connects together the cathode traces 510. The anode traces 506 are interleaved with (e.g., alternate with) the cathode traces 510. The buses 504 and 506 have an 'L' shape and are positioned to form a generally square structure. However, the busses 504 and 506 may have other shapes to form structures that are not square. Interconnections between layers may be made with vias, such as the via 512.

Figure 6:
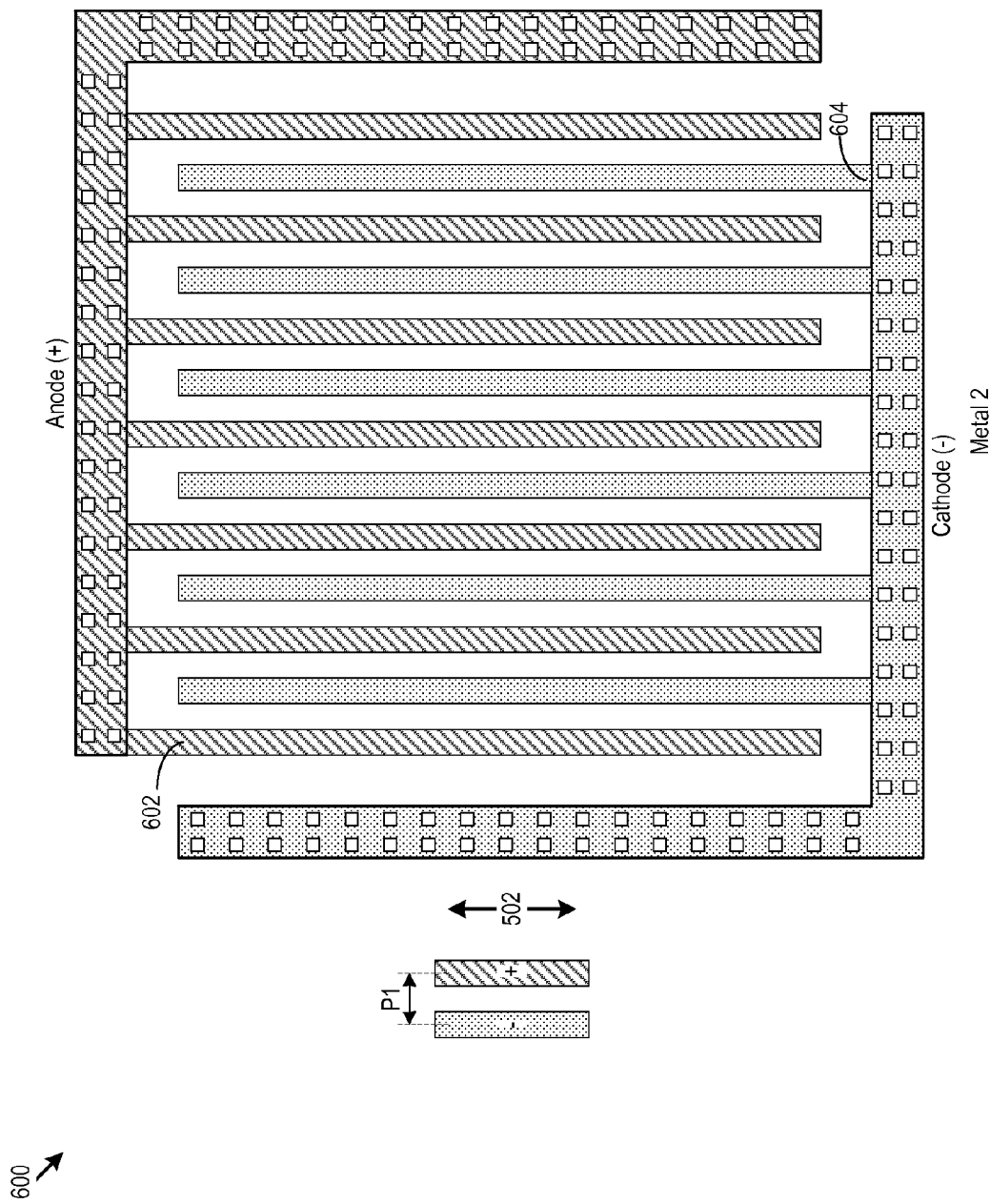
FIG. 6 shows a top view of an M2 layer in which conductive traces run in the same direction as in M2, and are positioned according to a design parameter (e.g., pitch) that has the first value also used in the M1 layer.

FIG. 6 shows a top view of an M2 layer 600 in which metal traces run in the same direction 502 as in M2, and are positioned according to a design parameter (e.g., pitch) that has the first value (e.g., P1) also used in the M1 layer. The traces include anode traces 602 and cathode traces 604. The traces in the M2 layer are arranged so that the traces substantially overlap with traces of different polarity in the M1 layer (and M3 layer). For example, the anode trace 602 is aligned from above with the cathode trace 510 when M2 is fabricated on top of M1. Similarly, the anode trace 506 is aligned from below with the cathode trace 604. The traces may have any desired length and therefore may overlap for any desired length in the direction in which they run. When the pitch design rule is the same for the layers M1 and M2, the layers may position the centers of the traces directly on top of one another. When the width rules are the same as well, the traces may substantially overlap in width as well.

Figure 7:
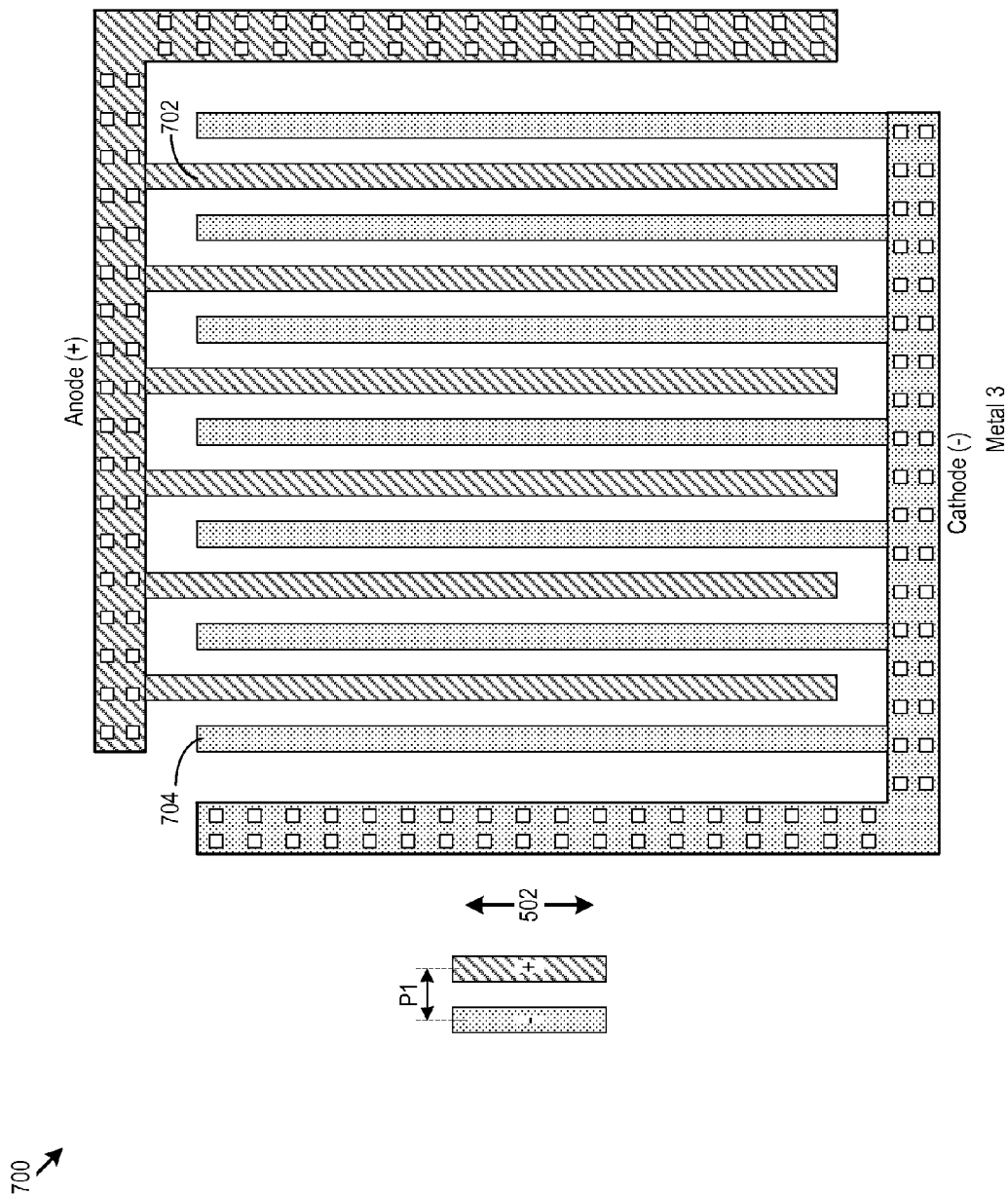
FIG. 7 shows a top view of an M3 layer in which conductive traces run in the same direction as M1 and M2, and are positioned according to a design parameter (e.g., pitch) that has the first value also used in the M1 and M2 layers.

FIG. 7 shows a top view of an M3 layer 700 in which metal traces run in the same direction 502 as M1 and M2, and are positioned according to a design parameter (e.g., pitch) that has the first value (e.g., P1) also used in the M1 and M2 layers. The traces include anode traces 702 and cathode traces 704. The traces in the M3 layer 700 are arranged so that the traces substantially overlap with traces of different polarity in the M2 layer. For example, the anode trace 702 is aligned from above with the cathode trace 604 when M3 is fabricated on top of M2. Similarly, the anode trace 602 is aligned from below with the cathode trace 704. With its alternation of anode and cathode traces, the layer M3 700 has a layout like the layer M1 500.

Figure 8:
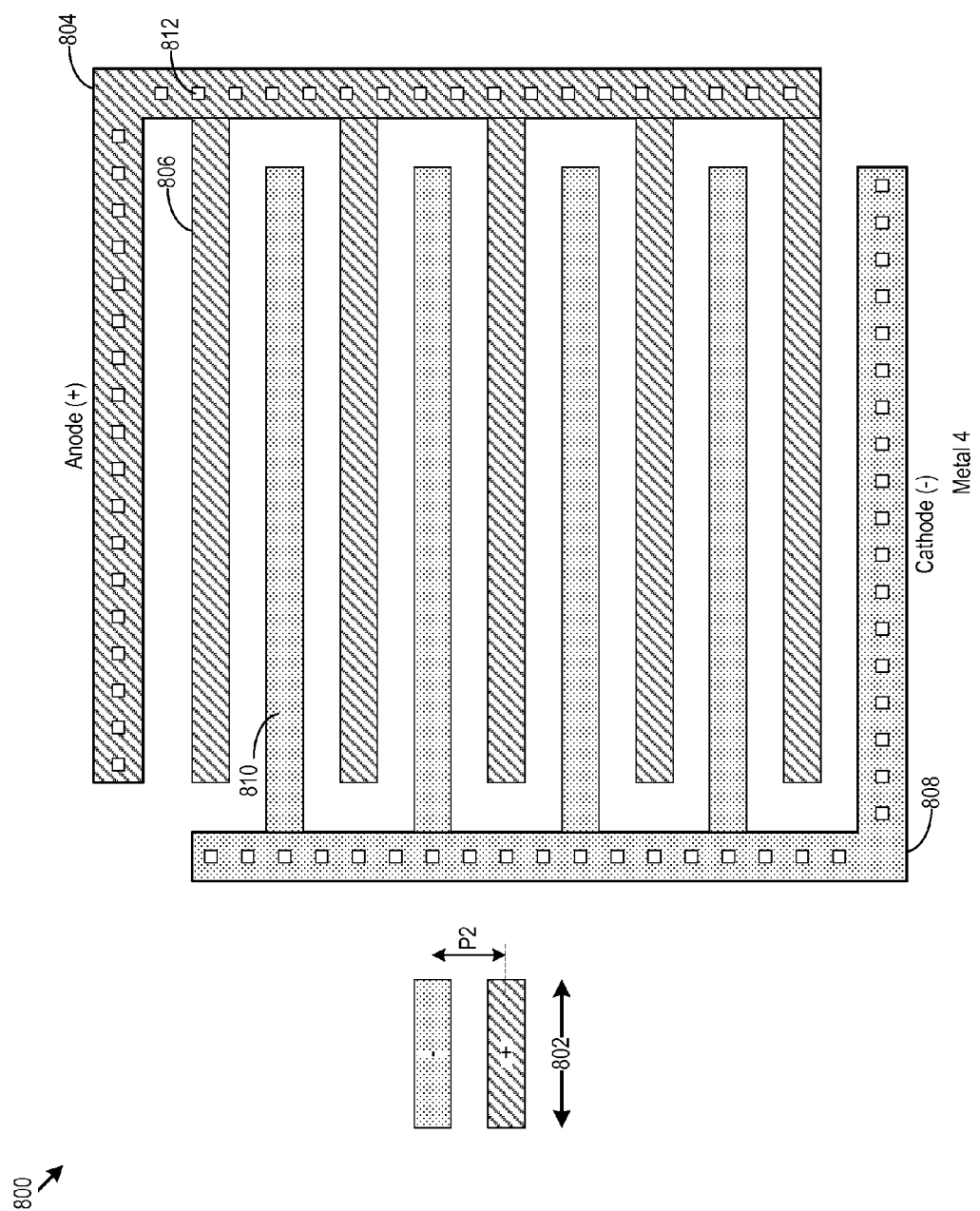
FIG. 8 shows a top view of an M4 layer in which conductive traces run in a different direction than in M1, M2, and M3 (e.g., an orthogonal direction) and are positioned according to a design parameter (e.g., pitch) having a different value than that used for the M1 layer.

FIG. 8 shows a top view of an M4 layer 800 in which metal traces run in a different direction 802 than in M1, M2, and M3. In particular, the direction 802 is orthogonal to the direction 502. The traces in the M4 layer 800 are positioned according to a design parameter (e.g., pitch) having a different value (e.g., P2) than that used for the M1 layer. Also, the traces in the M4 layer 800 adhere to design rules that require a greater width and a greater spacing for the metal traces.

In FIG. 8, an anode bus 804 connects together the anode traces 806, while a cathode bus 808 connects together the cathode traces 810. The anode traces 806 are interleaved with (e.g., alternate with) the cathode traces 810. The buses 804 and 806 have an 'L' shape and are positioned to form a generally square structure. However, the busses 804 and 806 (or the busses on any layer) may have other shapes to form structures that are not square. Interconnections between layers may be made with vias, such as the via 812.

The design rules change from the M3 layer 700 to the M4 layer 800. In particular, the value of the design rules for pitch, width, and spacing are increased in this example. The change in design rules would cause misalignment of the traces between the M3 layer 700 and the M4 layer 800 if the traces simply continued to run in the same direction. Instead of doing so, the traces in the M4 layer 800 are fabricated to run in a different direction (the direction 802) than the traces in the M3 layer 700.

Figure 9:
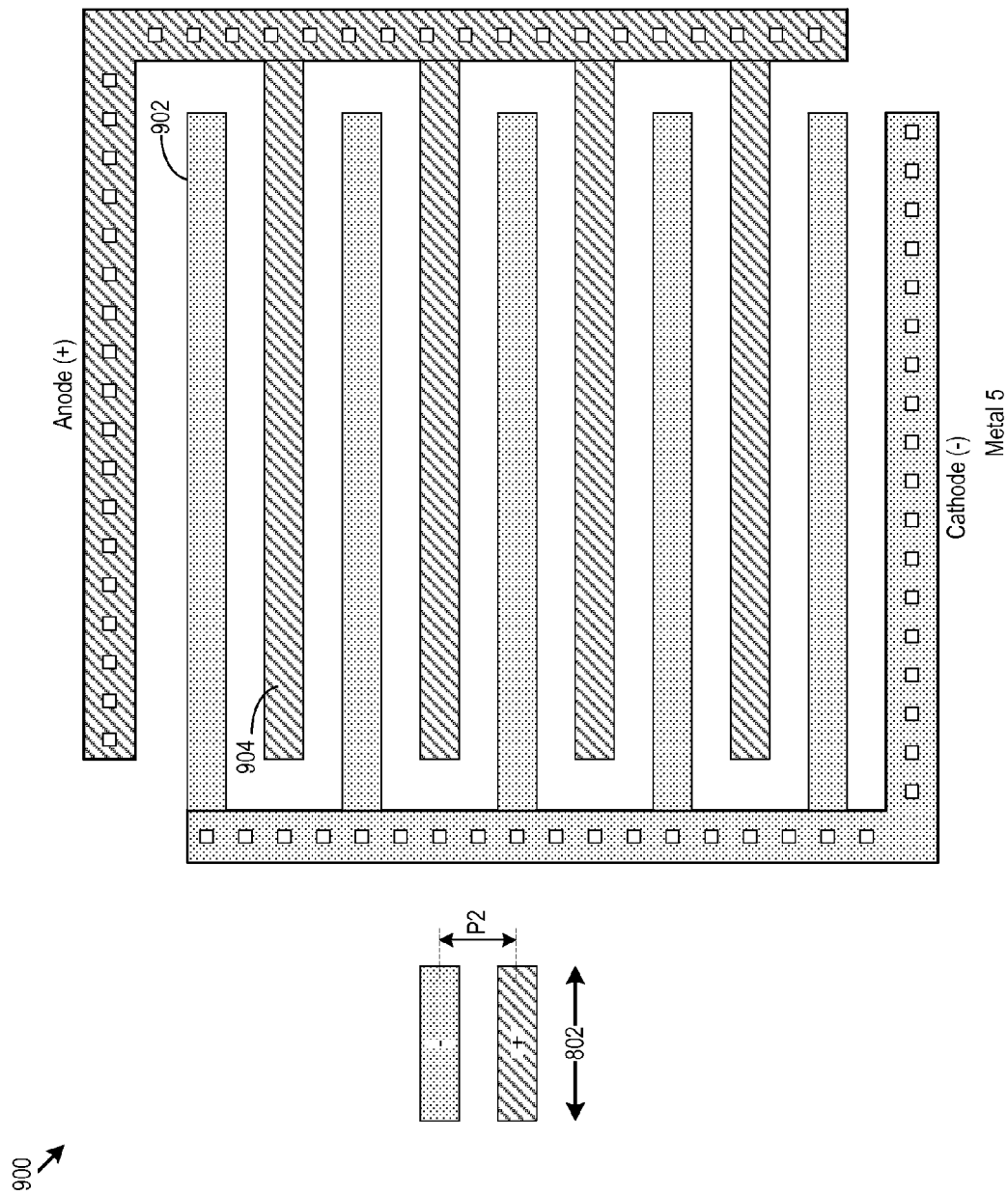
FIG. 9 shows a top view of an M5 layer in which conductive traces run in the same direction as in M4, and are positioned according to a design parameter (e.g., pitch) that has the different value used in the M4 layer.

FIG. 9 shows a top view of an M5 layer 900 in which metal traces run in the same direction as in the M4 layer 800. The metal traces are positioned according to a design parameter (e.g., pitch) set to the different value (e.g., P2) used previously in the M4 layer 800. In other words, the M5 layer 900 and the M4 layer 800 share the same design rules, but those design rules are different than the design rules in place in layers M1, M2, and M3.

The traces in the M5 layer 900 are arranged so that the traces substantially overlap with traces of different polarity in the M4 layer 800 (and M6 layer). For example, the anode trace 904 is aligned from above with the cathode trace 810 when M2 is fabricated on top of M1. Similarly, the anode trace 806 is aligned from below with the cathode trace 902. The traces may have any desired length and therefore may overlap for any desired length in the direction in which they run. When the pitch design rule is the same for the layers M4 and M5, the layers may position the centers of the traces directly on top of one another. When the width rules are the same as well, the traces may substantially overlap in width as well.

Figure 10:
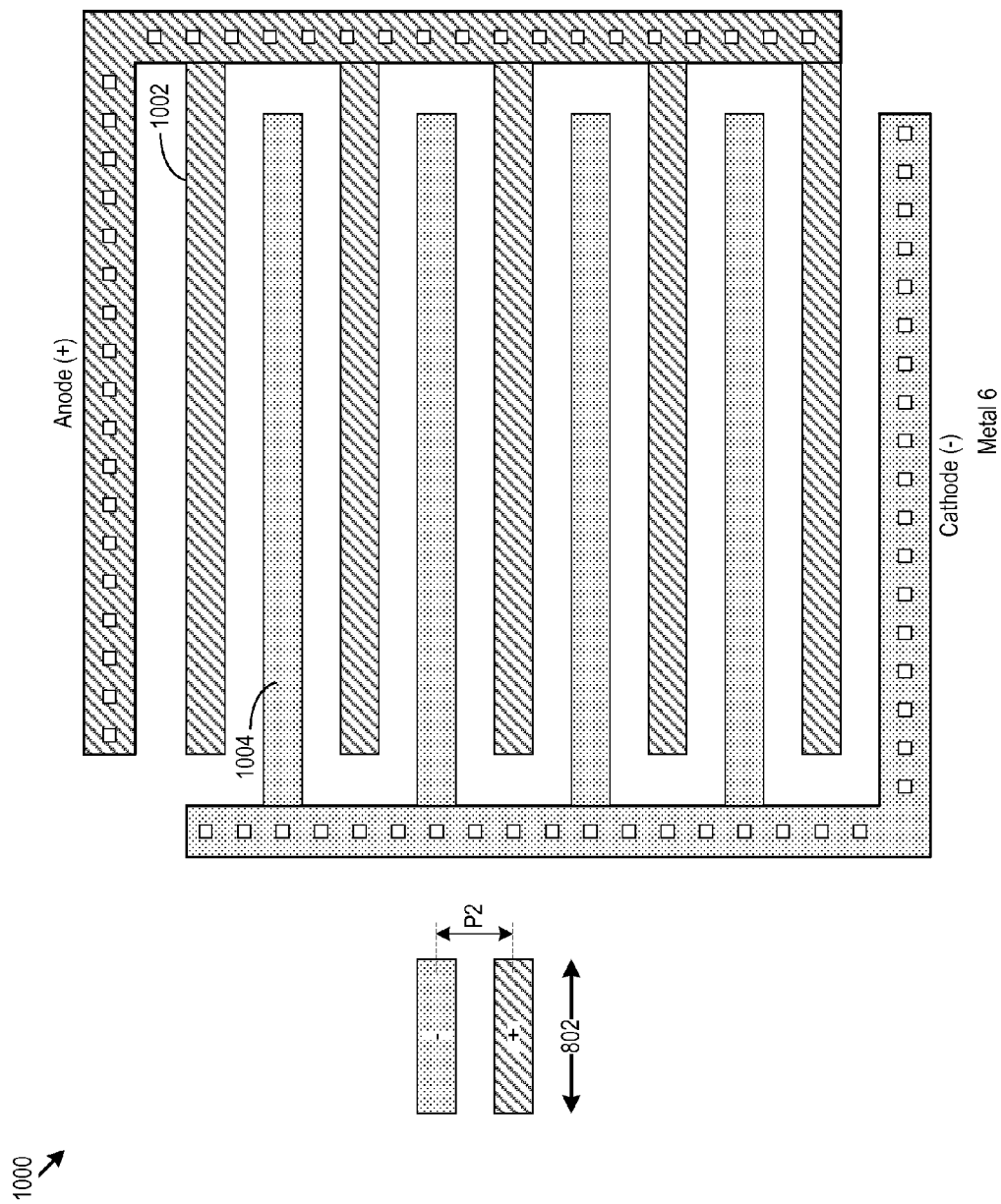
FIG. 10 shows a top view of an M6 layer in which conductive traces run in the same direction as M4 and M5, and are positioned according to a design parameter (e.g., pitch) that has the different value also used in the M4 and M5 layers.

FIG. 10 shows a top view of an M6 layer 1000 in which metal traces run in the same direction as in the M4 and M5 layers. The metal traces are also positioned according to a design parameter (e.g., pitch) that has the different value (e.g., P2) also used in the M4 and M5 layers. The traces include anode traces 1002 and cathode traces 1004. The traces in the M6 layer 1000 are arranged so that the traces substantially overlap with traces of different polarity in the M5 layer 900. For example, the anode trace 1002 is aligned from above with the cathode trace 902 when the layer M6 1000 is fabricated on top of the layer M5 900. Similarly, the anode trace 904 is aligned from below with the cathode trace 1004. With its alternation of anode and cathode traces, the layer M6 1000 has a layout like the layer M4 800.

Figure 11:
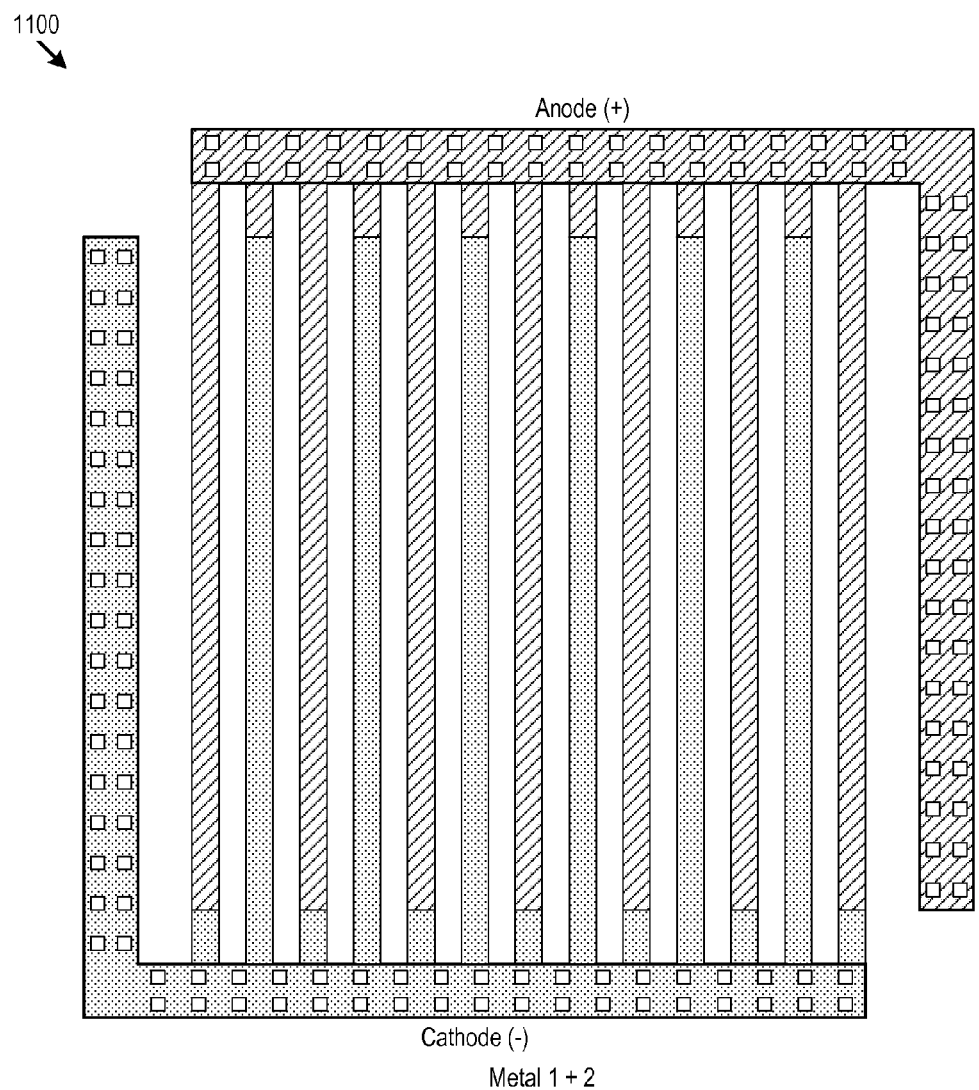
FIG. 11 shows a top view of the layers M1 and M2.

FIG. 11 shows a top view of a structure 1100 in which the layer M2 600 is fabricated on top of the layer M1 500. The structure 1100 illustrates the substantial overlap of the metal traces between the two layers. In part, the substantial overlap occurs because the design rules for the layer M1 500 are the same as the design rules for the layer M2 600. Accordingly, the centers of the metal traces, as well as their widths, are aligned and create substantial overlap. Additional similar overlap of alternative polarity also exists when the layer M3 700 is fabricated next, on top of the layer M2 600.

Figure 12:
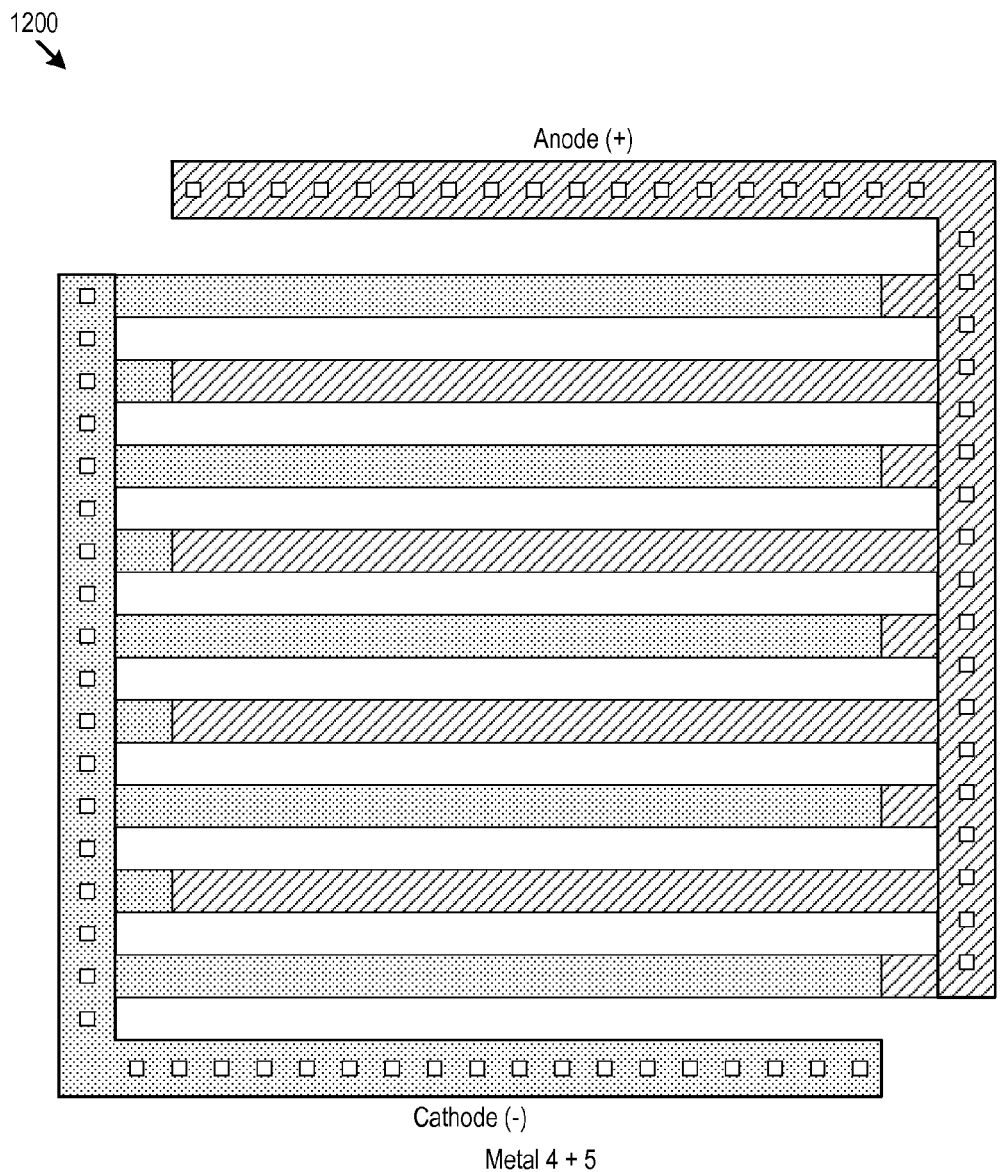
FIG. 12 shows a top view of the layers M4 and M5.

FIG. 12 shows a top view of a structure 1200 in which the layer M5 900 is fabricated on top of the layer M4 800. The structure 1200 illustrates the substantial overlap of the metal traces between the two layers. In part, the substantial overlap occurs because the design rules for the layer M5 900 are the same as the design rules for the layer M4 800. Accordingly, the centers of the metal traces, as well as their widths, are aligned and create substantial overlap. Additional similar overlap of alternative polarity also exists when the layer M6 1000 is fabricated next, on top of the layer M5 900.

Figure 13:
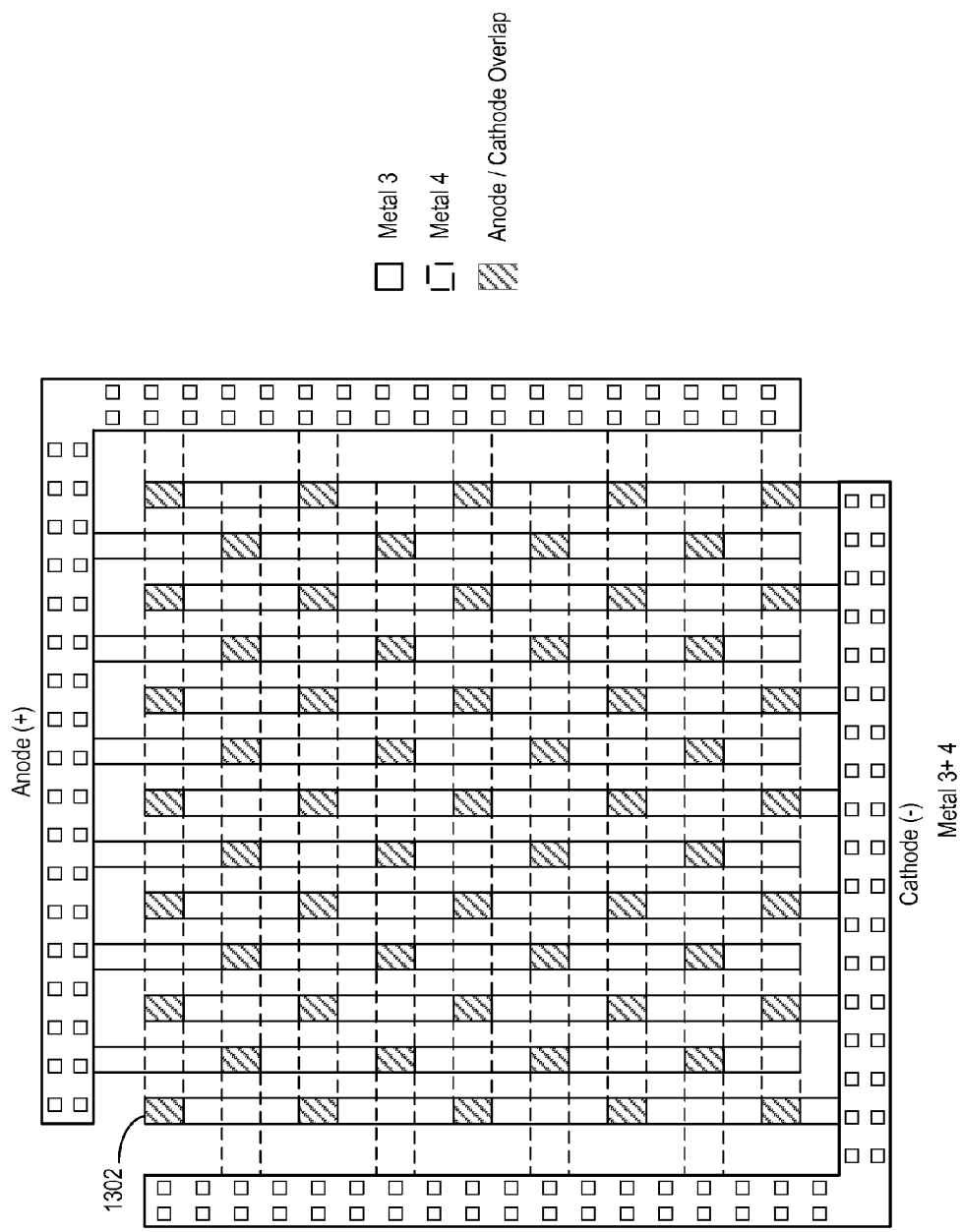
FIG. 13 shows a top view of the layers M3 and M4.

FIG. 13 shows a top view of a structure 1300 showing the M4 800 layer fabricated on top of the M3 layer 700. Note the different in design rules between the two layers. The different design rules result in larger width, spacing, and pitch for the traces in the M4 layer 800 compared to the M3 layer 700. Note also that the M4 layer 800 runs in a different direction than the M3 layer 700, thereby avoiding misalignment of the traces and loss of capacitance. Instead, with the change in direction, the anode and cathode traces overlap in many regions. The regions of overlap are shaded for emphasis, and one of them is labeled 1302 for reference. These regions of overlap help the structure recapture capacitance that would otherwise have been lost due to misalignment of the traces, when the traces simply run in the same direction.

Figure 14:
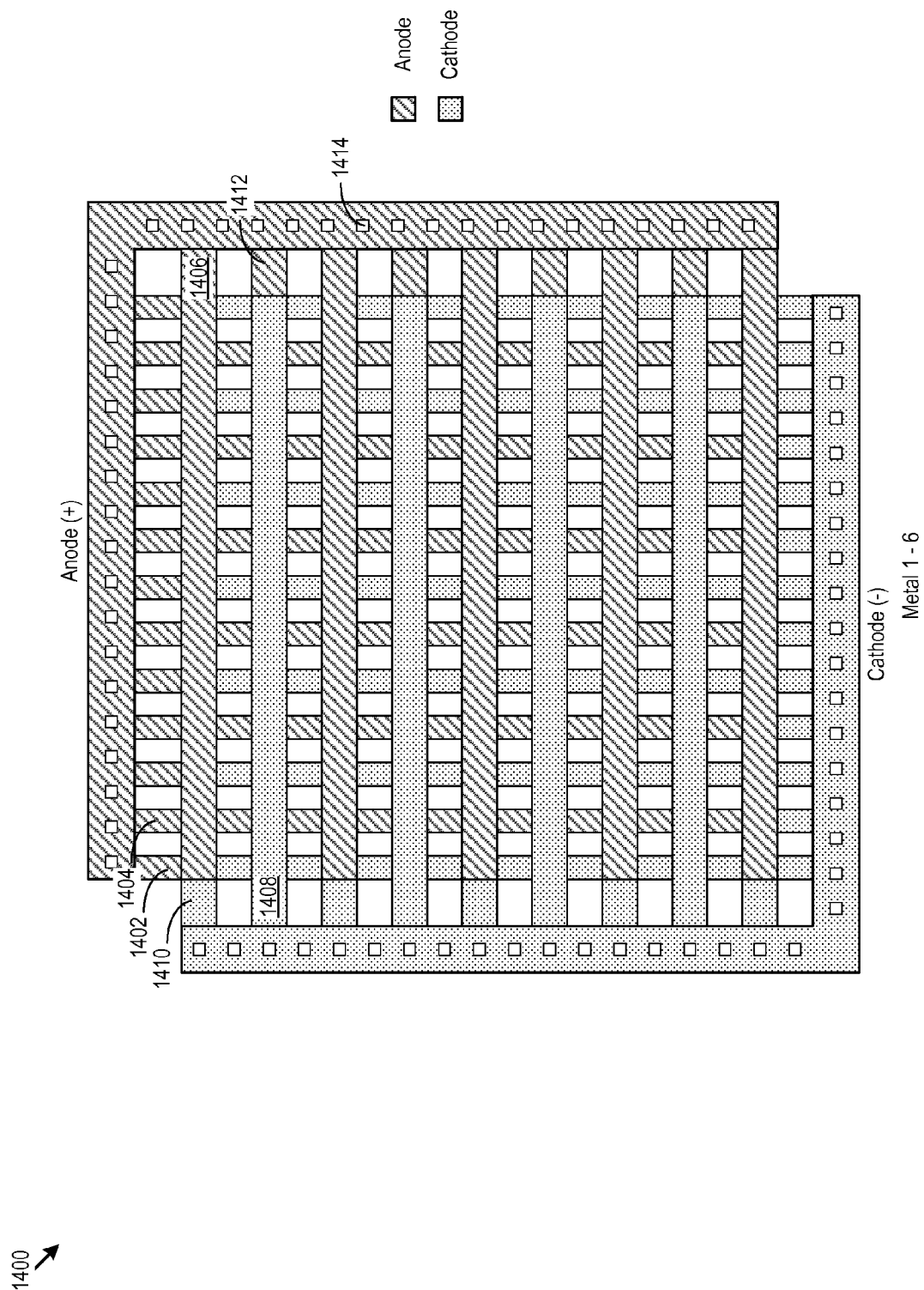
FIG. 14 shows a top view of the six layers M1, M2, M3, M4, M5, and M6.

FIG. 14 shows a top view of a structure 1400 in which all six layers M1, M2, M3, M4, M5, and M6 are fabricated one on top of the other, starting with the M1 layer 500. Accordingly, various parts of the layers show through at various places in FIG. 14, and many parts of the various layers are overlapped by subsequent layers. For example, FIG. 14 shows a portion of an M2 layer anode trace 1402 and an M3 layer anode trace 1404. As another example, FIG. 14 shows an M6 layer anode trace 1406, an M6 layer cathode trace 1408, and a portion of an M5 layer cathode trace 1410 and a portion of an M5 layer anode trace 1412. Vias (e.g., 1414) interconnect the cathode buses and anode busses between each layer.

Figure 15:
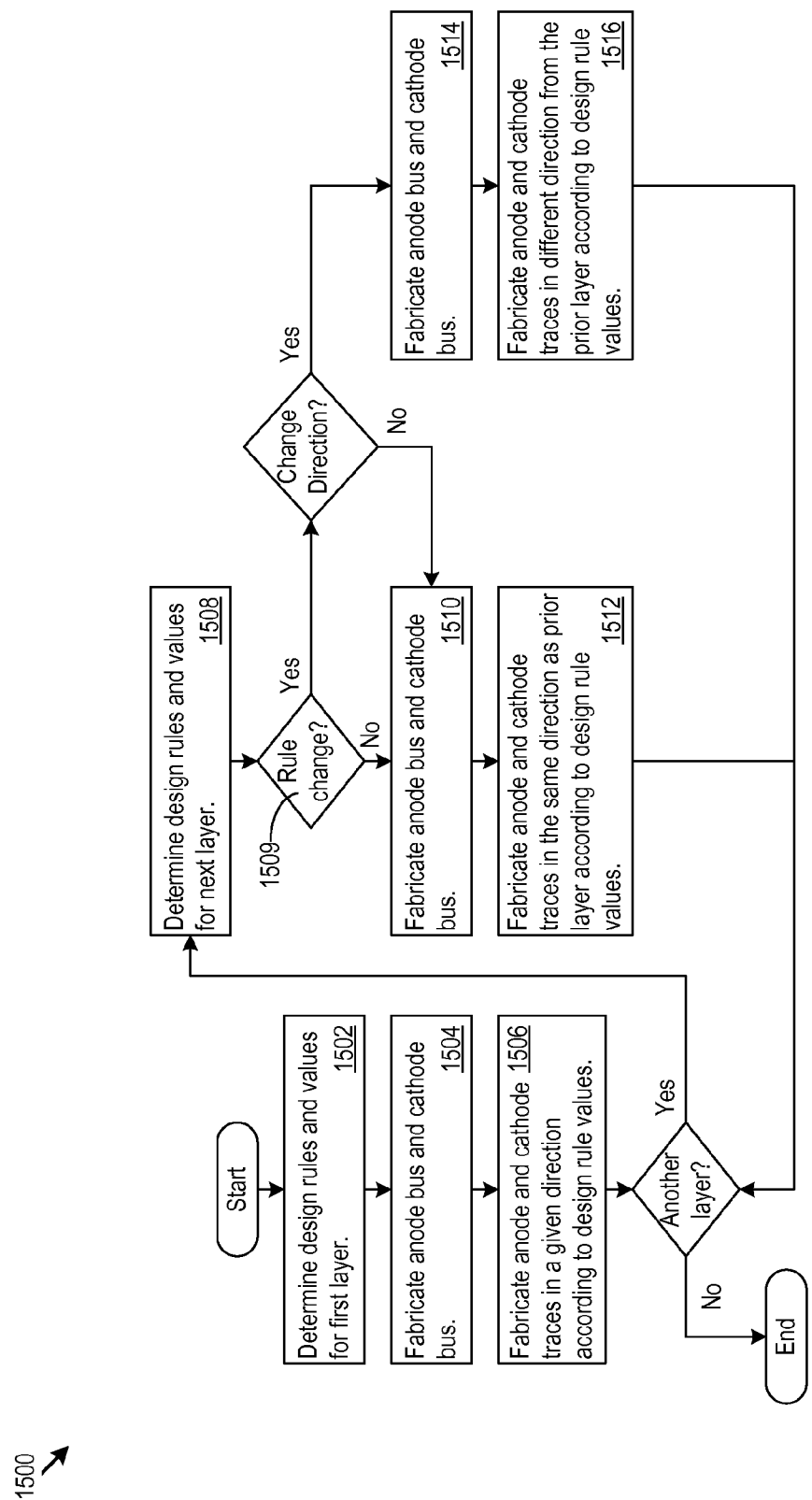
FIG. 15 shows an example fabrication method for a semiconductor structure such as a capacitor.

FIG. 15 shows an example fabrication process 1500 for a semiconductor structure such as a capacitor. The design rules and values are determined for the first layer (1502). Given the design rules, the fabrication process 1500 fabricates the anode and cathode busses (1504). Furthermore, the fabrication process 1500 fabricates the anode and cathode traces in a given direction, according to the design rule values (1506).

If there are additional layers to fabricate, then the fabrication process 1500 determines the design rules and values for the next layer (1508), and the fabrication process 1500 may determine to change direction of the traces in the next layer. The change in direction may happen when there is a rule change (e.g., a change in a value for a design rule, or a new rule) (1509), for example. However, the change in direction may happen regardless of whether there is a rule change, or in a layer subsequent to the one in which the rule changes, and regardless of whether the rule change would cause misalignment of traces between successive layers.

In some cases when there is no rule change, the fabrication process 1500 may, for the next layer, fabricate the anode and cathode busses (1510) and fabricate the anode and cathode traces in the same direction as the prior layer (1512). If the design rules have not changed, then the traces may substantially overlap in alternating polarities between the layers.

In some cases when there is a rule change, the fabrication process 1500 may, for the next layer, change the direction of the traces. In particular, on the next layer, the fabrication process 1500 fabricates the anode and cathode busses (1514) and fabricates the anode and cathode traces in a different direction than the prior layer (1516). The fabrication process 1500 may be carried out using a photolithography process to deposit the structure components in the desired patterns according to the width, spacing, and pitch (or other design rules) selected for the given layer.

Table 1 shows some example values in nanometers (nm) for design rules for capacitors that tolerate the noted voltages. Any other values may be enforced for any particular layers in other designs or in any particular fabrication process.

| Metal-oxide-metal design rule values | | | | |
| --- | --- | --- | --- | --- |
| Voltage (V) | | 1.5 V | 2.5 V | 3.3 V |
| Metal Width (nm) | M1, M2, M3 | 38 | 38 | 38 |
| | M4, M5, M6 | 44 | 44 | 44 |
| Metal Space (nm) | M1, M2, M3 | 46 | 51 | 69 |
| | M4, M5, M6 | 46 | 51 | 69 |

In the structures described above, traces change direction (e.g., rotate by 90 degrees) in the current layer when design rules change in the current layer, e.g., as compared to a prior layer. The prior layer may be the immediately prior layer, or another previous layer. The change in direction stops the misalignment of traces that run in the same direction and therefore helps the structures achieve maximum intra-layer coupling capacitance. The increased intra-layer coupling capacitance helps the structures also achieve the highest density structure for a particular capacitance value.

While various embodiments of the invention have been described, it will be apparent to those of ordinary skill in the art that many more embodiments and implementations are possible within the scope of the invention. Accordingly, the invention is not to be restricted except in light of the attached claims and their equivalents.

What is claimed is:

1. A method comprising:
fabricating, according to a first value of a design parameter, a first layer comprising first layer metal capacitor traces spaced according to the first value;
fabricating, according to a second value of the design parameter, a second layer comprising second layer metal capacitor traces spaced according to the second value and running in a different direction than the first layer metal capacitor traces; and
fabricating a first polarity electrode coupled to selected ones of the first and second layer metal capacitor traces; and
fabricating a second polarity electrode coupled to selected ones of the first and second layer metal capacitor traces.

2. The method of claim 1, further comprising:
determining a specific layer in a sequence of layers at which the design parameter changes from the first value to the second value; and
fabricating the second layer metal capacitor traces to run in the different direction, when the second layer is the specific layer.

3. The method of claim 1, where fabricating the second layer comprises running the second layer metal capacitor traces orthogonal to the first layer metal traces.

4. The method of claim 1, where fabricating the first layer metal capacitor traces and the second layer metal capacitor traces comprises alternating metal traces of different polarity.

5. The method of claim 1, where the design parameter comprises metallization pitch.

6. A structure comprising:
a first layer;
a second layer above the first layer and insulated from the first layer;
the first layer comprising:
first layer metal traces positioned according to a design parameter having a first value for the first layer;
the second layer comprising:
second layer metal traces positioned according to a second value for the design parameter for the second layer, the second value different than the first value; and
where:
the second layer metal traces run in a different direction than the first layer metal traces;
a first electrode configured to couple a first portion of the first layer metal traces; and
a second electrode configured to couple a second portion of the second layer metal traces.

7. The structure of claim 6, where the design parameter comprises pitch.

8. The structure of claim 6, where the design parameter comprises metal width.

9. The structure of claim 6, where the first electrode, the second electrode, or both comprise a capacitor electrode.

10. The structure of claim 6, further comprising:
a third layer above the second layer and insulated from the second layer;
third layer metal traces also positioned according to the second value for the design parameter; and where:
the third layer metal traces run in a same direction as the second layer metal traces.

11. The structure of claim 6, further comprising:
a fourth layer below the first layer and insulated from the first layer;
fourth layer metal traces also positioned according to the first value for the design parameter; and where:
the fourth layer metal traces run in a same direction as the first layer metal traces.

12. The structure of claim 6, where the different direction is orthogonal to the first layer metal traces.

13. The structure of claim 6, where the first electrode and second electrodes comprise a polarity electrode configured to couple the first portion of the first layer metal traces with the second portion of the second layer metal traces.

14. A structure comprising:
a first layer comprising:
first metal traces having a first spacing that meets a first design rule and that run in a first direction; and
a second layer vertically disposed from the first layer and comprising:
second metal traces arranged to meet a second design rule and that run in a second direction that is different than the first direction to avoid a misalignment among the first metal traces and second metal traces; and
a first electrode configured to couple a first portion of the first metal traces with a second portion of the second metal traces.

15. The structure of claim 14, where the second direction is orthogonal to the first direction.

16. The structure of claim 14, where the first metal traces comprise interleaved capacitor plates.

17. The structure of claim 14, where the first metal traces comprise interleaving capacitor plates of alternating polarity.

18. The structure of claim 14, where:
the first portion of the first metal traces comprise interleaving capacitor plates of a first polarity; and
the second portion of the second metal traces comprise interleaving capacitor plates of the first polarity.

19. The structure of claim 18, where:
the first layer further comprises a third portion of the first metal traces of a second polarity; and
the second layer further comprises a fourth portion of the second metal traces of the second polarity, and
the structure further comprises a second electrode configured to couple the third portion of the first metal traces with the fourth portion of the second metal traces.

* * * * *